United States Patent [19]

Yamashiro

[11] 4,322,639

[45] Mar. 30, 1982

[54] VOLTAGE DETECTION CIRCUIT

[75] Inventor: Osamu Yamashiro, Ohmiya, Japan

[73] Assignee: Hitachi, Ltd., Tokyo, Japan

[21] Appl. No.: 886,425

[22] Filed: Mar. 14, 1978

Related U.S. Application Data

[63] Continuation of Ser. No. 718,009, Aug. 26, 1976, abandoned.

[51] Int. Cl.³ .............................................. H03K 5/153
[52] U.S. Cl. .................................. 307/350; 307/358; 307/363; 307/296 R
[58] Field of Search ............. 307/205, 215, 214, 350, 307/358, 362, 363, 304, 296 R

[56] References Cited

U.S. PATENT DOCUMENTS

| | | | |
|---|---|---|---|
| 3,628,070 | 12/1971 | Heuner et al. | 307/362 |
| 3,922,569 | 11/1975 | Nabetani et al. | 307/350 |
| 3,949,545 | 4/1976 | Chihara | 307/350 X |

*Primary Examiner*—John Zazworsky
*Attorney, Agent, or Firm*—Craig and Antonelli

[57] ABSTRACT

A voltage detection circuit adapted for use in an electronic timepiece in which a source voltage from a battery power source, etc. is voltage-divided and applied to an input of a logic circuit including complementary MIS FETs so as to compare the divided source voltage with a reference potential level and to detect whether the source voltage is above a predetermined value or not. In the logic circuit, the logic threshold is set in the neighborhood of the threshold voltage of one MIS FET to establish a reference potential level. Advantages are provided in integrating the circuit in a semiconductor integrated circuit such that parameters relevant to the manufacturing processes do not influence the reference potential level very much and the dispersion in the detected voltage due to the fluctuations in the manufacturing processes are minimized.

13 Claims, 6 Drawing Figures

F I G. 1
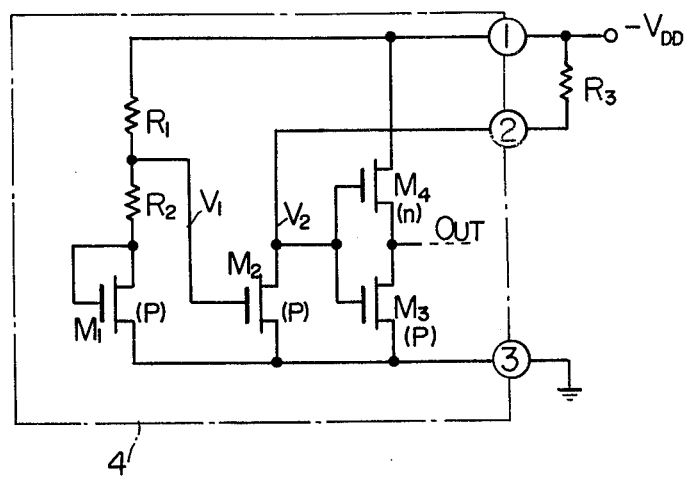
F I G. 2
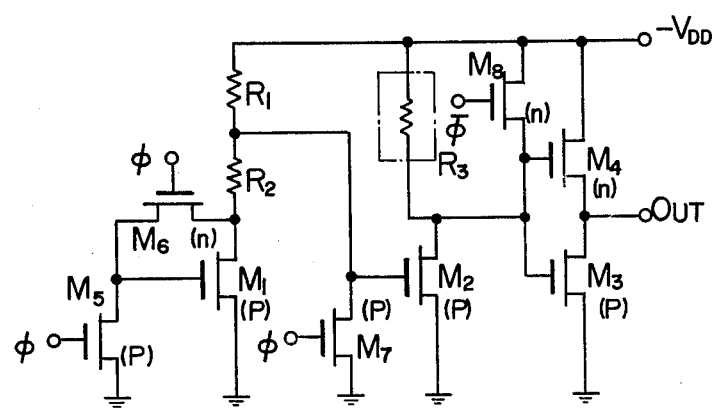

VOLTAGE DETECTION CIRCUIT

This application is a continuation of patent application Ser. No. 718,009, filed on Aug. 26, 1976, now abandoned.

BACKGROUND OF THE INVENTION

1. Field of the Invention

This invention relates to a voltage detection circuit, and more particularly to a voltage detection circuit formed of an integrated circuit of insulated gate type field effect transistors (hereinbelow, referred to as MIS FETs).

2. Description of the Prior Art

It is necessary for a battery-powered electronic device, e.g., electronic wristwatch, to indicate the time of battery exchange by some means after the consumption of a predetermined capacity of the battery since a battery is sooner or later used up. Such conventional devices are described in for example, Japanese Laid-Open Patent Publications No. 49-71968 dated July 11, 1974 (Japanese Patent Application No. 47-112465) and No. 51-13280 dated Feb. 2, 1976 (Japanese Patent Application No. 49-80932). The consumption of the battery capacity appears as a decrease in the electromotive force. Hence, the time for battery exchange can be detected by monitoring the decrease in the electromotive force of the battery.

In this case, especially for an electronic wristwatch, it is preferable to integrate a voltage detection circuit in a monolithic semiconductor integrated circuit (IC) from the points of cost performance and packaging space. The voltage detection circuit can be basically formed of series resistances $R_A$ and $R_B$ for dividing the source voltage $V_{DD}$ from a battery source such as mercury, silver or lithium battery and an inverter INV receiving this divided voltage as the input, as shown in FIG. 6. In an IC chip including a semiconductor integrated circuit, however, resistive elements formed of MIS structure resistors or diffused resistors have a relatively large dispersion of resistances, and the dispersion of the threshold voltage of the MIS FETs constituting the inverter in the IC chip and the temperature variation of the threshold voltage of the complete circuit are relatively large. Therefore, the above circuit cannot be directly used as the voltage detection circuit in an IC. For example, the electromotive force of the silver battery of a rating voltage 1.5 volt used in the electronic wristwatch, etc. gradually falls down to about 1.4 volt and then rapidly falls down, while the assured minimum operative voltage for the electronic circuit is 1.25 volt. Thus, the voltage detection circuit should detect the voltage of around 1.32 volt with an accuracy not lower than ±0.075 V.

SUMMARY OF THE INVENTION

Therefore, an object of this invention is to provide a voltage detection circuit of high accuracy having the main part thereof integrated in an MIS integrated circuit.

Another object of this invention is to provide a voltage detection circuit which reduces the number of process parameters on which the accuracy of the detected voltage depends to achieve high accuracy.

A further object of the invention is to provide a voltage detector circuit capable of reducing the fluctuations of the detected voltage due to the manufacturing dispersion of the threshold voltage of the circuit components.

Another object of this invention is to provide a voltage detection circuit capable of minimizing the fluctuations of the detected voltage by the temperature variation.

Another object of this invention is to provide a voltage detection circuit capable of minimizing the fluctuations of the detected voltage from the point of circuit design against the wide variations of various parameters such as the threshold voltage of the circuit components and the temperature.

Another object of this invention is to provide a voltage detection circuit integrated in a semiconductor IC capable of adjusting voltage detection level after the manufacture of the integrated circuit.

Another object of this invention is to provide a voltage detection circuit capable of minimizing the power consumption.

Another object of this invention is to provide a voltage detection circuit for a battery power source adapted for use in an electronic wristwatch.

According to an aspect of this invention, there is provided a voltage detection circuit comprising a first voltage dividing circuit for dividing a power source voltage to be detected and a logic circuit formed of MIS FETs for providing a reference potential level and comparing the divided voltage with the reference potential level to discriminate whether the power source voltage is higher than a predetermined value or not. The logic circuit includes a driving MIS FET and a load MIS FET and the channel conductance $\beta$ of the former is set sufficiently large compared to that of the latter to set the logic threshold of the circuit in the neighborhood of the logic threshold of the driving MIS FET. Therefore, the reference potential level is mostly determined by the threshold voltage of the driving MIS FET and is influenced little by the parameters relevant to the process conditions such as the transconductance gm of the load MIS FET and the ratio of the transconductances gmr of the two FETs. Therefore, the shift of the detection voltage due to the fluctuations in the manufacturing processes is minimized.

On the other hand, the gate voltage of the MIS FETs of the logic circuit may be adjusted by a second voltage dividing circuit. This gate voltage may be adjusted to compensate the temperature dependency of the logic threshold voltage of the logic circuit. Thus, the compensation for the temperature dependence of the detected voltage is made possible.

Further, an MIS FET may be used in the second voltage dividing circuit to minimize the shift of the detected voltage due to the manufacturing dispersion of the threshold voltage of the MIS FETs.

Yet further, the load element of the first voltage dividing circuit may be formed of a variable resistor provided outside of the semiconductor integrated circuit. Then, the adjustment of the detection level is made possible even after the manufacture of the integrated circuit by selecting the resistance of said variable resistor at an appropriate value.

Further, the minimization of the power consumption of the voltage detection circuit can be achieved by providing clock control means for periodically preventing the formation of dc paths for the logic circuit and the respective voltage dividing circuits. A voltage detection circuit capable of the achievement of such power consumption minimization is further adapted for an electronic wristwatch.

The above and other objects, features and advantages of this invention will become more apparent from the following detailed description of the preferred embodiments of the invention when taken in conjunction with the accompanying drawings.

BRIEF DESCRIPTION OF THE DRAWINGS

FIG. 1 is a circuit diagram of an embodiment of the voltage detection circuit according to this invention.

FIGS. 2 to 5 are circuit diagrams of other embodiments of the voltage detection circuit according to this invention.

DESCRIPTION OF THE PREFERRED EMBODIMENTS

Figure 3:
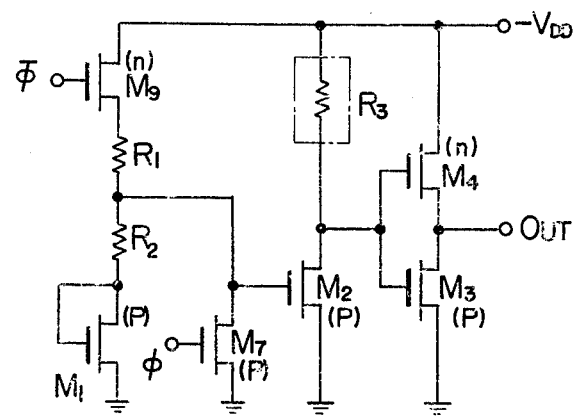

Hereinbelow, description will be made of the preferred embodiments of the invention in conjunction with the accompanying drawings.

FIG. 1 is the circuit diagram of an embodiment of a voltage detection circuit which comprises a power source terminal 1 connected to a source voltage $V_{DD}$, a ground terminal 3, and a bias circuit formed of a series connection of ohmic (linear) resistors $R_1$ and $R_2$ and a p-channel enhancement MIS FET $M_1$ formed in a semiconductor integrated circuit chip 4. The potential $V_1$ at the interconnection of the resistors $R_1$ and $R_2$ of this biasing circuit is applied to the gate of a p-channel enhancement MIS FET $M_2$ having a grounded source terminal and a drain terminal connected to an external terminal 2. An external resistor $R_3$ is connected between the external terminal 2 and the source terminal 1 to form a voltage dividing circuit with the MIS FET $M_2$. The divided voltage $V_2$ by this voltage dividing circuit is applied to the input of a complementary inverter circuit formed of an n-channel enhancement MIS FET $M_4$ and a p-channel enhancement MIS FET $M_3$. The output of this inverter circuit is used as the detection output of the source voltage and is used to drive a display means (not shown) such as an LCD (liquid crystal display) or an LED (light emitting diode) for indicating the time of battery exchange to a user.

In this invention, the ratio of the channel conductances $\beta$ of the MIS FETs $M_3$ and $M_4$ is so set by the geometric dimensions of these elements that the logic threshold of the complementary inverter circuit $M_3$ and $M_4$ to be approximately equal to the threshold voltage $V_{thp}$ of the p-channel MIS FET $M_3$. Further, the biasing voltage $V_1$ is set to drive the MIS FET $M_2$ in the saturation region so as to provide a voltage detection output of high accuracy. Further, the resistance $R_3$ of the external resistor is set appropriately for bringing the divided voltage in the voltage dividing circuit $R_3$ and $M_2$ to coincide with the logic threshold of the complementary inverter $M_3$ and $M_4$ when the source voltage falls down to the voltage to be detected, considering the dispersion of the circuit components in the manufacture of the semiconductor IC and the temperature dependence of the logic threshold of the inverter circuit $M_3$ and $M_4$.

The logic threshold $V_{LT}$ of the complementary inverter circuit is represented by $$V_{LT} = \frac{\sqrt{\beta r}\,(V_{DD} - V_{thn}) + V_{thp}}{1 + \sqrt{\beta r}}$$

$$= \frac{\left(1 + \sqrt{\beta r}\right)V_{thp} - \sqrt{\beta r}\,V_{thp} + \sqrt{\beta r}\,(V_{DD} - V_{thn})}{1 + \sqrt{\beta r}}$$

$$= V_{thp} - \frac{\sqrt{\beta r}}{1 + \sqrt{\beta r}}\,\{V_{DD} - (V_{thn} + V_{thp})\}$$

where $V_{thp}$ and $V_{thn}$ are threshold voltages of the MIS FETs $M_3$ and $M_4$ and $\beta r$ is the ratio of the channel conductance of the MIS FET $M_4$ to that of the MIS FET $M_3$. Hence, the threshold voltage $V_{LT}$ of the inverter circuit may be brought approximately equal to that of the MIS FET $M_3$ by setting the second term on the right hand side of equation (1) negligible, i.e. by selecting the conductance ratio $\beta r$ to satisfy $$\sqrt{\beta r} = \sqrt{\frac{\beta_n W_4/L_4}{\beta_p W_3/L_3}} \ll 1 \tag{2}$$

where $\beta_p$ and $\beta_n$ are channel conductivities of the MIS FETs $M_3$ and $M_4$, $W_3$ and $W_4$ the channel widths of the MIS FETs $M_3$ and $M_4$, and $L_3$ and $L_4$ the channel lengths of the MIS FETs $M_3$ and $M_4$. For example, when $\beta_n = 12\ \mu A/V$, $\beta_p = 4\ \mu A/V$ and $V_{DD} = 1.5\ V$, the width-to-length ratios $W_3/L_3$ and $W_4/L_4$ may be selected to be $$W_3/L_3 = 1000\ \mu m/9\ \mu m \tag{3}$$

and $$W_4/L_4 = 9\ \mu m/1000\ \mu m \tag{4}$$

According to the above structure, the purposes of this invention can be achieved by the following reasons.

The manufacturing dispersion and the temperature dependence of the logic threshold of the inverter circuit can be arranged to depend only on those of the MIS FET $M_3$, being free from the influence of those of the MIS FET $M_4$, by setting the logic threshold of the inverter circuit to be approximately equal to the threshold voltage of the MIS FET $M_3$. Therefore, the adjustment to be described later is made easy.

Namely, even when there are some dispersions in the biasing circuit ($R_1$, $R_2$, $M_1$), the MIS FET $M_2$ constituting the voltage dividing circuit, and the logic threshold of the inverter circuit (threshold voltage of the MIS FET $M_3$) formed in a monolithic semiconductor IC chip, the inverter circuit can be set to perform inversion when the source voltage falls down to a predetermined value, by setting the resistance $R_3$ of the external variable resistance at a predetermined value considering these dispersions. The variation of the divided voltage due to a temperature change can be compensated by adopting two MIS FETs $M_1$ and $M_2$. Namely, upon a temperature rise, the threshold voltage of the MIS FET $M_2$ decreases, but at the same time the biasing voltage for driving this MIS FET $M_2$ also decreases due to the decrease of the threshold voltage of the MIS FET $M_1$. Thus, the temperature compensation of the voltage dividing circuit is achieved. Since the biasing voltage for the inverter circuit can be set at the midst of the possible temperature variation range of the logic threshold, the voltage detection can be made with high accuracy. In this case, since the logic threshold of the inverter is equivalent to the threshold voltage of the MIS FET M₃, the bias setting can be easily done.

The above analysis will become more apparently understandable from the following quantitative circuit analysis.

(a) The logic threshold of the inverter circuit is made approximately equal to the threshold voltage of the MIS FET M₃.

(b) The width-to-length ratio W/L of the MIS FET M₁ is made sufficiently large to satisfy $$V_1 = \frac{R_2}{R_1 + R_2} (V_{DD} - V_{th}) + V_{th} \qquad (2)$$

where $V_1$ is the biasing voltage, $V_{th}$ is the threshold voltage of the MIS FET M₁ and $V_{DD}$ the source voltage.

(c) The value of $$\frac{R_2}{(R_1 + R_2)}$$

is appropriately set to operate the MIS FET M₂ in the saturation region. The reason for this condition is that when the MIS FET M₂ operates in the triode-like characteristic region (drain voltage saturation region) the temperature dependence thereof becomes large.

When the above conditions (a), (b) and (c) are satisfied, the voltage detection level is determined from the following equation (6).

$$V_{DD} = V_{thp} + \frac{2}{\beta_2 \cdot R_3 \cdot \left(\frac{R_2}{R_1 + R_2}\right)^2} \qquad (6)$$

Here, $V_{thp}$ is the threshold voltage of the p-channel MIS FETs M₁ and M₂, and $\beta_2$ the channel conductance of the MIS FET M₂.

In equation (6), the first term $V_{thp}$ and the second term $$\frac{2}{\beta_2 \cdot R_3 \cdot \left(\frac{R_2}{R_1 + R_2}\right)^2}$$

on the right hand side vary in the opposite direction to cancel each other against a temperature change. The two variations can be arranged to cancel out each other almost perfectly by appropriately setting the external resistance R₃ and the internal resistance $$\frac{R_2}{R_2 + R_2}.$$

In other words, the external resistance R₃ may be adjusted to satisfy $$R_3 = \frac{2}{\beta_2 \left(\frac{R_2}{R_1 + R_2}\right)^2 (V_{DD} - V_{thp})} \qquad (7)$$

According to the above embodiment, a voltage detection circuit having a voltage detection accuracy of ±60 mV in a temperature range of 0° to 40° C. was provided. This accuracy is sufficiently adaptable for a battery checking circuit in an electronic wristwatch.

The qualitative and quantitative effects of the embodiment of FIG. 1 can be listed as follows.

(1) Since the ratio βr of the channel conductance of the MIS FET M₃ to that of the MIS FET M₄ is set large to bring the logic threshold almost equal to the threshold voltage of the MIS FET M₃, the number of parameters relevant to the circuit components and giving influence to the shift or variation of the detection voltage is reduced to only the threshold voltage of the MIS FET M₃. In other words, it is only necessary to consider the dispersion of the threshold voltage.

(2) Since the gate voltage of the MIS FET M₂ is adjusted by a voltage dividing circuit including the MIS FET M₁, the temperature dependence of the current flowing through the MIS FET M₂ can be adjusted to conform to the temperature dependence of the logic threshold voltage of the logic circuit formed of the MIS FETs M₃ and M₄. Thus, the temperature dependence of the detection voltage can be minimized. The polarity as well as the magnitude of the temperature dependence of the current flowing through the MIS FET M₂ can be adjusted by the gate voltage.

(3) The shift of the detection voltage due to the manufacturing dispersion of the threshold voltage of the MIS FETs can be reduced by the use of the MIS FET M₁.

(4) The adjustment of the voltage detection level after the manufacture of the integrated circuit is made possible by the use of the external resistance R₃ outside the integrated circuit.

This invention is not limited to the above embodiment and various circuit alternations and modifications are possible.

For example, the conductivity type of the MIS FETs may be reversed with the invention of the polarity of the source voltage.

Further, the biasing circuit or voltage dividing circuit integrated in an IC chip may be clock-controlled or driven to achieve low power dissipation as shown in FIGS. 2 to 5.

FIG. 2 shows a voltage detection circuit which includes MIS FETs M₅ to M₇ driven by a clock pulse φ and an MIS FET M₈ driven by the inverted clock pulse $\bar{\phi}$ in addition to the circuit of FIG. 1. The MIS FET M₅ and M₇ clock-controls the bias circuit and the voltage dividing circuit, respectively. The MIS FET M₈ prevents the malfunction of the inverter circuit in clock drive of the circuit, but may be dispensed with when the external resistance R₃ is not extremely large.

FIG. 3 shows another clock-driven system for the bias circuit. In this embodiment, the bias circuit (R₁, R₂, M₁) is clock-driven by the addition of an n-channel MIS FET M₉ connected on the power source side.

Figure 4:
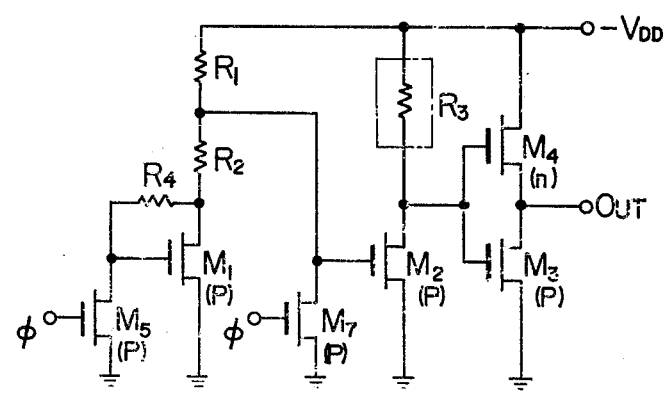

FIG. 4 shows another embodiment, in which the MIS FET M₆ of FIG. 2 is replaced with a resistor R₄. In this case, care should be taken to the fact that a current is allowed to flow through the resistors R₁, R₂ and R₄ and the MIS FET M₅.

Figure 5:
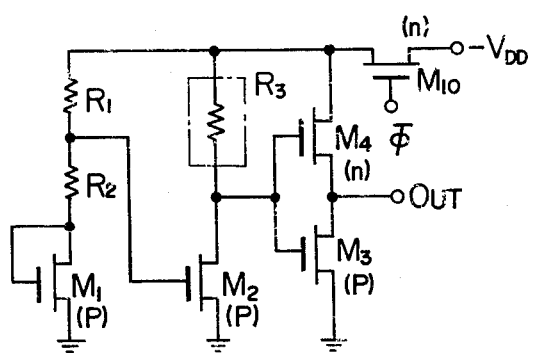
Figure 6:
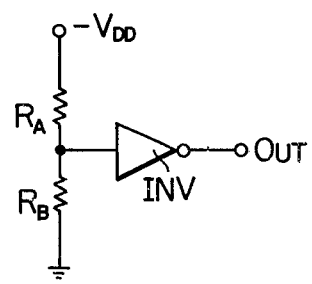
FIG. 6 is a circuit diagram of an example of the basic conventional voltage detection circuit.

FIG. 5 shows another embodiment, in which a MIS FET M₁₀ is provided on the power source side. In this case, the number of elements is reduced, but care should be taken to the fact that the manufacturing dispersion and the temperature dependence of the MIS FET M₁₀ affect the detection output.

The inverter circuit is preferably formed of a complementary type circuit from the point of the signal transfer characteristic. But it is not limited to this type and may be replaced with one comprising a load and drive elements of the same conductivity type MIS FETs or with one using a resistor as the load element.

In practice, the present circuit for a battery checker is suitable to be used under clock control. If the circuit is rendered enable by a clock pulse having a pulse width of 7.8 milliseconds at every two seconds for example, the power dissipation is reduced to $1/(1024\times 2)$ that under no clock control.

This invention is widely applicable as a voltage detection circuit substantially formed of a MIS integrated circuit.

What is claimed is:

1. A voltage detection circuit comprising:
   a logic circuit including a first MISFET of a first conductivity type and a second MISFET of a second conductivity type being opposite to said first conductivity type, wherein the gate electrodes of said first and said second MISFETs are commonly connected, the drain electrodes of said first and said second MISFETs are commonly connected to a detection output electrode, and the source electrodes of said first and said second MISFETs are respectively connected to first and second prescribed potentials;
   a voltage dividing circuit for applying a divided voltage of a potential difference between said first and said second prescribed potentials to said gate electrodes of said first and said second MISFETs in said logic circuit, including a third MISFET of said second conductivity type and a load resistive element, wherein the source electrode of said third MISFET is connected to said second prescribed potential and the drain electrode of said third MISFET is connected to said first prescribed potential through said load resistive element and is coupled with said gate electrodes of said first and said second MISFETs; and
   a bias circuit for applying a bias voltage to the gate electrode of said third MISFET, including first and second linear resistors connected in series between said first and said second prescribed potentials, wherein the juncture of said first and said second linear resistors is connected to the gate electrode of said third MISFET, thus compensating for temperature variations in threshold voltages of said first, second, and third MISFETs, wherein
   said bias circuit controllably supplies the bias voltage at said juncture to said gate electrode of said third MISFET in response to clock control means connected between said gate electrode of said third MISFET and said second prescribed potential terminal; and
   wherein $$\sqrt{\frac{\beta_1 W_1/L_1}{\beta_2 W_2/L_2}} << 1$$

where
$\beta_1$ is the channel conductance of said first MISFET,
$W_1$ is the channel width of said first MISFET,
$L_1$ is the channel length of said first MISFET,
$\beta_2$ is the channel conductance of said second MISFET, $W_2$ is the channel width of said second MISFET, and
$L_2$ is the channel length of said second MISFET.

2. A voltage detection circuit according to claim 1, wherein said gate electrode of said third MISFET is periodically supplied with said bias voltage at said juncture in said bias circuit.

3. A voltage detection circuit according to claim 2, wherein said bias circuit further includes a clock driven fourth MISFET of said second conductivity type disposed in series with said second linear resistor disposed between said juncture and second prescribed potential terminal, the gate electrode of said fourth MISFET being coupled to receive a clock pulse input.

4. A voltage detection circuit comprising:
   a logic circuit including a first MISFET of a first conductivity type and a second MISFET of a second conductivity type being opposite to said first conductivity type, wherein the gate electrodes of said first and said second MISFETs are commonly connected, the drain electrodes of said first and said second MISFETs are commonly connected to a detection output electrode, and the source electrodes of said first and said second MISFETs are respectively connected to first and second prescribed potentials;
   a voltage dividing circuit for applying a divided voltage of a potential difference between said first and said second prescribed potentials to said gate electrodes of said first and said second MISFETs in said logic circuit, including a third MISFET of said second conductivity type and a load resistive element, wherein the source electrode of said third MISFET is connected to said second prescribed potential and the drain electrode of said third MISFET is connected to said first prescribed potential through said load resistive element and is coupled with said gate electrodes of said first and said second MISFETs; and
   a bias circuit for applying a bias voltage to the gate electrode of said third MISFET, including first and second linear resistors connected in series between said first and said second prescribed potentials, wherein the juncture of said first and said second linear resistors is connected to the gate electrode of said third MISFET, thus compensating for temperature variations in threshold voltages of said first, second, and third MISFETs, in which said bias circuit further includes a fourth MISFET of said second conductivity type connected in series with said second linear resistor.

5. A voltage detection circuit according to claim 4, further comprising a fifth MISFET of said first conductivity type connected in series with said first linear resistor between said first prescribed reference potential terminal and said juncture, the gate electrode of said fifth MISFET being coupled to receive a clock pulse signal, wherein the gate and drain electrodes of said fourth MISFET are commonly connected, and wherein said fourth and fifth MISFETs are of complementary channel conductivity types.

6. A voltage detection circuit according to claim 4, further comprising clock control means connected between said gate electrode of said third MISFET and said second prescribed potential for periodically limiting dc current flowing through said voltage dividing circuit.

7. A voltage detection circuit according to claim 4, comprising clock control means connected in series with said logic circuit between said first and second prescribed potentials for periodically limiting dc current flowing through said logic circuit.

8. A voltage detection circuit comprising, in a semiconductor integrated circuit chip:
- a bias circuit including first and second linear resistors and a first MISFET of a first conductivity type connected in series between a voltage source terminal and a reference potential terminal, the gate and the drain electrodes of said first MISFET being connected to one end of said second resistor, and the juncture between said first and second resistors producing a bias voltage,
- a voltage dividing circuit including a series connection of a second MISFET of said first conductivity type and an external resistor for supplying a divided voltage of a potential difference between a voltage applied to said voltage source terminal and a voltage applied to said reference potential terminal, wherein the source electrode of said second MISFET is connected to said reference potential terminal and the drain electrode of said second MISFET is connected to said voltage source terminal through said external resistor and the gate electrode of said second MISFET is connected to said juncture in said bias circuit, said second MISFET operating in the saturation region by a bias voltage supplied from said bias circuit; and
- an inverter circuit including a third MISFET of said first conductivity type serving as a driving means and a fourth MISFET of a second conductivity type, opposite to said first conductivity type, serving as a load means, wherein the gate electrodes of said third and said fourth MISFETs are commonly connected to said drain electrode of said second MISFET, the drain electrodes of said third and said fourth MISFETs are commonly connected to a detection output electrode, and the source electrodes of said third and said fourth MISFETs are respectively connected to said reference potential terminal and to said voltage source terminal,
- values of circuit parameters in said inverter circuit being so determined as to set a logic threshold of said inverter circuit to be substantially equal to the threshold voltage of said third MISFET, and said divided voltage being supplied to the input of said inverter circuit to provide a voltage detection output from said detection output electrode of said inverter circuit.

9. A voltage detection circuit according to claim 8, in which said inverter circuit comprises complementary MISFETs having a large channel conductance ratio.

10. A voltage detection circuit according to claim 8, in which said first MISFET has a large width-to-length ratio of its channel and the biasing voltage $V_1$ at the juncture between said first and second resistors in said bias circuit satisfies the following relation:

$$V_1 = \frac{R_2}{R_1 + R_2}(V_{DD} - V_{th}) + V_{th},$$

where
$V_{th}$ is the threshold voltage of said first MISFET,
$R_1$, $R_2$ the resistance values of said first and second resistors, respectively, and
$V_{DD}$ the power source voltage,
the value of $$\frac{R_2}{R_1 + R_2}$$

is set to operate said second MISFET in its saturation region, said first, second, and third MISFETs are of the same conductivity type,
the resistance $R_3$ of said external resistor satisfies the following formula:

$$R_3 = \frac{2}{\beta_2 \left(\frac{R_2}{R_1 + R_2}\right)^2 (V_{DD} - V_{th})},$$

where $\beta_2$ is the channel conductance of the second MISFET, whereby the temperature dependence of current through said second MISFET can be adjusted to conform to the temperature dependence of the logic threshold voltage of said inverter circuit to compensate for the temperature dependency of a detection voltage at the output of the inverter.

11. A voltage detection circuit according to claim 8, wherein
said third MISFET has a channel conductance greater than that of said fourth MISFET, and the logic threshold of said inverter circuit is set to be substantially equal to the threshold voltage of said third MISFET, and
said second MISFET is biased in accordance with a voltage which appears at said juncture in said bias circuit, proportional to said potential difference.

12. A voltage detection circuit comprising:
- a logic circuit including a first MISFET of a first conductivity type and a second MISFET of a second conductivity type being opposite to said first conductivity type, wherein the gate electrodes of said first and said second MISFETs are commonly connected, the drain electrodes of said first and said second MISFETs are commonly connected to a detection output electrode, and the source electrodes of said first and said second MISFETs are respectively connected to first and second prescribed potentials;
- a voltage dividing circuit for applying a divided voltage of a potential difference between said first and said second prescribed potentials to said gate electrodes of said first and said second MISFETs in said logic circuit, including a third MISFET of said second conductivity type and a load resistive element, wherein the source electrode of said third MISFET is connected to said second prescribed potential and the drain electrode of said third MISFET is connected to said first prescribed potential through said load resistive element and is coupled with said gate electrodes of said first and said second MISFETs; and
- a bias circuit for applying a bias voltage to the gate electrode of said third MISFET, including first and second linear resistors connected in series between said first and said second prescribed potentials wherein the juncture of said first and said second linear resistors is connected to the gate electrode of said third MISFET, in which said bias circuit further includes a fourth MISFET of said second conductivity type connected in series with said second linear resistor, wherein the drain electrode and the source electrode of said fourth MISFET are connected in series with the second linear resistor between said juncture and second prescribed potential terminal.

13. A voltage detection circuit according to claim 12, wherein the gate and drain electrodes of said fourth MISFET are commonly connected, wherein at least said first and second linear resistors and said fourth MISFET in said bias circuit, said third MISFET in said voltage dividing circuit and said first and second MISFETs in said logic circuit are formed in a semiconductor integrated circuit chip.

* * * * *